United States Patent
Kim et al.

(10) Patent No.: US 11,054,474 B2
(45) Date of Patent: Jul. 6, 2021

(54) METHOD AND APPARATUS FOR ESTIMATING STATE OF BATTERY

(71) Applicant: SAMSUNG ELECTRONICS CO., LTD., Suwon-si (KR)

(72) Inventors: Jinho Kim, Yongin-si (KR); SangDo Park, Seoul (KR); Tae Won Song, Yongin-si (KR); Sungick Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 331 days.

(21) Appl. No.: 15/718,084

(22) Filed: Sep. 28, 2017

(65) Prior Publication Data

US 2018/0143259 A1 May 24, 2018

(30) Foreign Application Priority Data

Nov. 22, 2016 (KR) .................... 10-2016-0155700

(51) Int. Cl.
*G01R 31/36* (2020.01)
*G01R 31/367* (2019.01)
(Continued)

(52) U.S. Cl.
CPC ............ *G01R 31/367* (2019.01); *B60L 58/12* (2019.02); *G01R 31/392* (2019.01); *B60L 2250/16* (2013.01); *B60L 2260/44* (2013.01)

(58) Field of Classification Search
CPC ..... G01R 31/367; G01R 31/392; B60L 58/12; B60L 2250/16; B60L 2260/44
See application file for complete search history.

(56) References Cited

U.S. PATENT DOCUMENTS

| | | | |
|---|---|---|---|
| 2006/0181245 A1* | 8/2006 | Mizuno | G01R 31/3648 320/132 |
| 2010/0033132 A1* | 2/2010 | Nishi | B60K 6/365 320/136 |

(Continued)

FOREIGN PATENT DOCUMENTS

JP 2016-121295 A 5/2016

OTHER PUBLICATIONS

Dey et al; Estimation of Lithium-Ion Concentrations in Both Electrodes of a Lithium-Ion Battery Cell; ASME 2015 Dynamic Systems and Control Conference; Oct. 2015. (Year: 2015).*

(Continued)

*Primary Examiner* — Regis J Betsch
*Assistant Examiner* — Jeremy A Delozier
(74) *Attorney, Agent, or Firm* — NSIP Law

(57) ABSTRACT

According to one aspect, a method to estimate a state of a battery includes receiving physical quantity information about a sensed physical quantity of a battery, obtaining estimated information of the battery from a battery model based on the received physical quantity information. The battery model includes a training model configured to determine internal battery information comprising potential information of an internal material of the battery based on the physical quantity information and a mathematical function. The method further includes calculating an ion concentration in the battery using the mathematical function based on the internal battery information to determine the estimated information of the battery.

14 Claims, 7 Drawing Sheets

(51) Int. Cl.
*G01R 31/392* (2019.01)
*B60L 58/12* (2019.01)

(56) References Cited

U.S. PATENT DOCUMENTS

| | | | |
|---|---|---|---|
| 2010/0324848 A1 | 12/2010 | Cho et al. | |
| 2011/0054816 A1* | 3/2011 | Prada | G01R 31/367 |
| | | | 702/63 |
| 2012/0078552 A1 | 3/2012 | Mingant et al. | |
| 2012/0271578 A1* | 10/2012 | Nareid | G01R 31/3648 |
| | | | 702/63 |
| 2015/0081237 A1* | 3/2015 | Ye | B60L 58/12 |
| | | | 702/63 |
| 2016/0363632 A1* | 12/2016 | Park | G01R 31/3648 |

OTHER PUBLICATIONS

Du, Jiani, et al. "State of charge estimation for Li-ion battery based on model from extreme learning machine." Control Engineering Practice 26 (2014): 11-19.

* cited by examiner

300

METHOD AND APPARATUS FOR ESTIMATING STATE OF BATTERY

CROSS-REFERENCE TO RELATED APPLICATION(S)

This application claims the benefit under 35 U.S.C. § 119(a) of Korean Patent Application No. 10-2016-0155700 filed on Nov. 22, 2016, in the Korean Intellectual Property Office, the entire disclosure of which is incorporated herein by reference for all purposes.

BACKGROUND

1. Field

The following description relates to a method and apparatus for estimating a state of a battery.

2. Description of Related Art

A battery management system (BMS) may estimate a state of a battery, for example, a state of charge (SoC) and a state of health (SoH), for an efficient operation of the battery. Available uses for a battery may be expanded based on accuracy in estimating an SoC and an SoH of the battery, and thus the BMS may need to accurately estimate a state of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one aspect, a method to estimate a state of a battery includes receiving physical quantity information about a sensed physical quantity of a battery, obtaining estimated information of the battery from a battery model based on the received physical quantity information. The battery model includes a training model configured to determine internal battery information comprising potential information of an internal material of the battery based on the physical quantity information and a mathematical function. The method further includes calculating an ion concentration in the battery using the mathematical function based on the internal battery information to determine the estimated information of the battery.

The potential information may include solid-phase electrode potential information and electrolyte potential information.

The sensed physical quantity may include any one or combination of a sensed current, a sensed voltage, and a sensed temperature, and the estimated information comprises any one or combination of an internal temperature, an estimated voltage, and a state of charge (SoC) of the battery.

The internal battery information may further include any one or combination of a current density distribution of an electrode of the battery and overpotential information related to the electrode of the battery.

The training model may be configured to receive previous potential information determined during a period previous to a current period.

The training model may include an input layer configured to receive the physical quantity information as an input and an output layer configured to output the internal battery information.

The training model may be based on a neural network corresponding to at least one mathematical function used to calculate the internal battery information among a plurality of functions of an electrochemical model.

The neural network may be trained based on an output value in response to an input parameter of a reference battery and on an output parameter of the reference battery. The input parameter may include any one or combination of potential information about an internal substance of the reference battery from a first period, information about an ion concentration in an electrolyte of the reference battery from the first period, information about an ion concentration in a solid-phase of an electrode of the reference battery from the first period, internal temperature information about the reference battery from the first period, open-circuit voltage (OCV) information about the reference battery from the first period, and input current information about the reference battery from a second period. The output parameter may include any one or combination of potential information of the internal material of the reference battery from the second period, information on a current density distribution in the electrode of the reference battery from the second period, or overpotential information of the reference battery from the second period.

The reference battery may be the battery.

A non-transitory computer-readable storage medium may instructions that, when executed by a processor, cause the processor to perform the method described above.

According to one aspect, an apparatus for estimating a state of a battery includes a memory configured to store a battery model, and a controller configured to receive physical quantity information about a sensed physical quantity of a battery, input the received physical quantity information to the battery model, and obtain estimated information of the battery from the battery model. The battery model includes a training model configured to determine internal battery information comprising potential information of an internal material of the battery based on the physical quantity information and a mathematical function. The controller calculates an ion concentration in the battery using the mathematical function based on the internal battery information, and determines the estimated information of the battery.

The potential information may include solid-phase electrode potential information of the battery and electrolyte potential information of the battery.

The sensed physical quantity may include any one or combination of a sensed current, a sensed voltage, and a sensed temperature, and the estimated information may include at least one of an internal temperature, an estimated voltage, and a state of charge (SoC) of the battery.

The internal battery information may further include any one or combination of a current density distribution of an electrode of the battery and overpotential information relate to the electrode of the battery.

The training model may be configured to receive previous potential information determined during a period previous to a current period.

The training model may include an input layer configured to receive the physical quantity information as an input and an output layer configured to output the internal information.

The training model may be based on a neural network corresponding to at least one function used to calculate the internal information among a plurality of functions of an electrochemical model.

The neural network may be trained based on an output value in response to an input parameter of a reference battery and on an output parameter of the reference battery. The input parameter may include any one or combination of potential information about an internal substance of the reference battery from a first period, information about an ion concentration in an electrolyte of the reference battery from the first period, information about an ion concentration in a solid-phase of an electrode of the reference battery from the first period, internal temperature information about the reference battery from the first period, open-circuit voltage (OCV) information about the reference battery from the first period, or input current information about the reference battery from a second period. The output parameter may include any one or combination of potential information of the internal material of the reference battery from the second period, information on a current density distribution in the electrode of the reference battery from the second period, or overpotential information of the reference battery from the second period.

The reference battery may be the battery.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
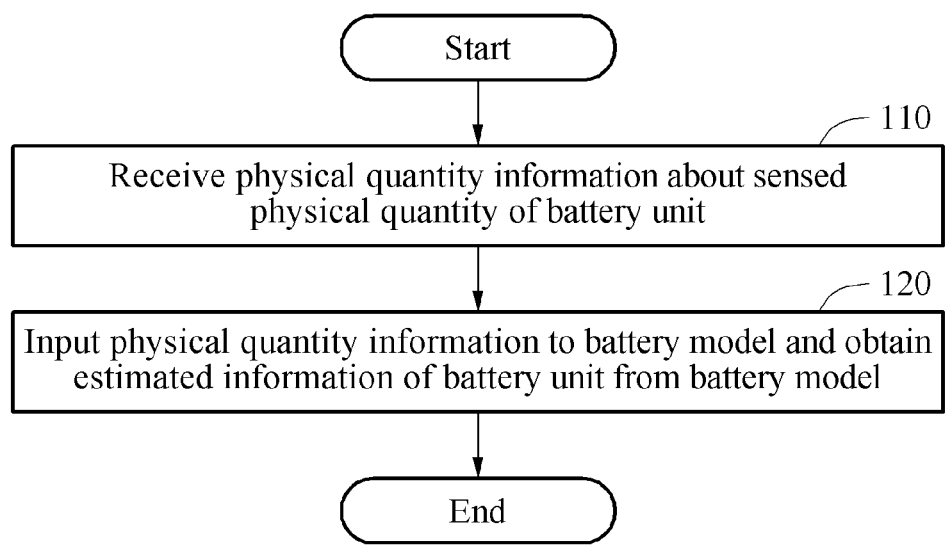
FIG. 1 is a flowchart illustrating an example of a method of estimating a state of a battery.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. \

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

FIG. 1 is a flowchart illustrating an example of a method of estimating a state of a battery.

The method of estimating a state of a battery, hereinafter simply referred to as a battery state estimating method, is performed by an apparatus to estimate a state of a battery, hereinafter simply referred to as a battery state estimating apparatus.

Referring to FIG. 1, in operation 110, the battery state estimating apparatus receives physical quantity information on a sensed physical quantity of a battery.

The battery described herein may be a battery cell, a battery module, or a battery pack.

In one example, at least one sensor, for example, a current sensor, a voltage sensor, and a temperature sensor, senses a physical quantity of a battery, for example, at least one of a current, a voltage, or a temperature, respectively. The battery state estimating apparatus receives information about the sensed physical quantity from the sensor. That is, the battery state estimating apparatus may receive the physical quantity information of the battery using the sensor. For example, the battery state estimating apparatus may collect at least one of current information about the battery using the current sensor, voltage information using the voltage sensor, and temperature information using the temperature sensor. The temperature of the battery used herein refers to an external temperature of the battery. The battery state estimating apparatus may receive external temperature information of the battery from the temperature sensor.

As shown in FIG. 1, in operation 120, the battery state estimating apparatus inputs the received physical quantity information to a battery model, and obtains estimated information of the battery from the battery model. The battery model receives the physical quantity information as an input. The estimated information of the battery is determined through a training model and various functions of the battery model. In one example, the battery model may include the training model configured to determine internal information including potential information of materials comprising the battery. In addition, the battery model may include at least one function. A function may refer to a calculating, modeling, or mathematical function. For example, the battery model may include at least one function for calculating an ion concentration in the battery based on the internal information determined by the training model. Additionally or alternatively, the battery model includes at least one function used to determine the estimated information of the battery based on the internal information determined by the training model. The estimated information is at least one of, for example, an internal temperature of the battery, an estimated voltage of the battery, or a state of charge (SoC) of the battery. In addition, the battery model may calculate an estimated value of an open-circuit voltage (OCV) of the battery. The battery model will be described in more detail with reference to FIG. 2.

The battery model is an electrical circuit model that models an input characteristic and an output characteristic of the battery based on a configuration of an electrical circuit, or an electrochemical model that models a characteristic of a chemical action in the battery. However, the battery model is not limited to the example types described in the foregoing.

The battery model is stored in a memory included in the battery state estimating apparatus, but is not limited thereto. For example, the battery model is stored in a memory located outside the battery state estimating apparatus.

Figure 2:
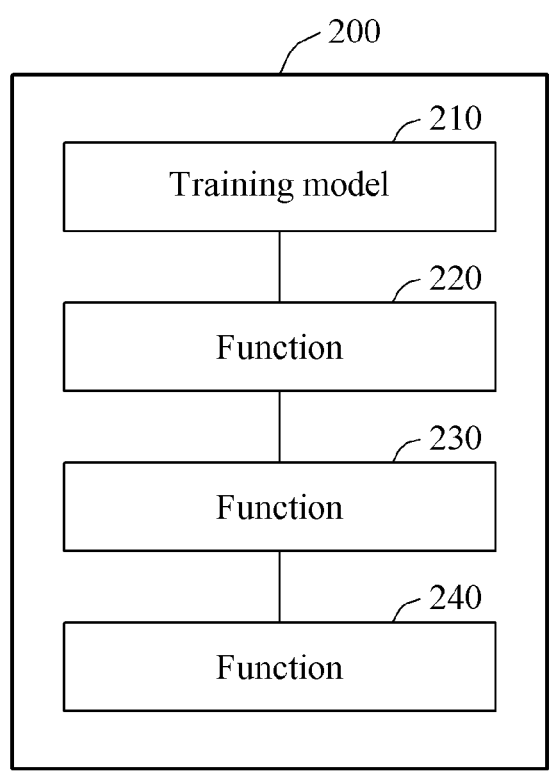
FIG. 2 is a diagram illustrating an example of a battery model.

FIG. 2 is a diagram illustrating an example of a battery model.

Referring to FIG. 2, a battery model 200 includes a training model 210, a function 220, a function 230, and a function 240.

Although not illustrated in FIG. 2, a battery state estimating apparatus may read a model parameter of the battery model 200, for example, shape information and/or material property information. The shape information may include, for example, a thickness of each electrode, a thickness of a membrane, and/or a size of a particle of an active material of each electrode. The material property information may include, for example, an electrical conductivity, an ionic conductivity, and an activation energy.

The battery model 200 receives physical quantity information of a battery, including, for example, current information from a current period. In addition, the battery model 200 receives, as an input, previous potential information and a previous ion concentration. The previous potential information refers to potential information of the battery determined in a previous period before the current period. The potential information of the battery includes, for example, a solid-phase electrode potential information and electrolyte potential information. The solid-phase electrode potential information is also referred to as electronic potential information, and the electrolyte potential information is also referred to as ionic potential information. The previous ion concentration is an ion concentration, for example, a lithium (Li) concentration in an electrolyte and a Li concentration in a solid-phase electrode, calculated in the previous period.

The training model 210 determines internal information about the battery based on the current information of the battery from the current period, the previous potential information, and the previous ion concentration, or a combination thereof. The internal information includes current potential information of an internal substance of the battery, for example, a solid-phase electrode potential and an electrolyte potential from the current period. In addition, the internal information may further include at least one of information on a current density distribution in the electrode of the battery and overpotential information in the electrode of the battery.

In one example, the training model 210 corresponds to at least one main function among a plurality of functions of an electrochemical model to calculate the solid-phase electrode potential information, the electrolyte potential information, and/or the information on the current density distribution in an electrode of the battery. Based on an example, the training model 210 corresponds to a matrix calculation function that is generated during calculation of the main function of the electrochemical model. The training model 210 will be described in more detail with reference to FIG. 3. In addition, the training model 210 may be trained in advance to output a result substantially identical to a result of the calculation of the main function, or a result of the matrix calculation function. Such training is described in more detail with reference to FIG. 4.

The function 220 may include a function used to calculate an ion concentration in an electrolyte of the battery based on the internal information determined by the training model 210. The ion concentration in an electrolyte may be a concentration of metal ions associated with a positive electrode active material of the battery. The ion concentration in an electrolyte is, for example, a Li ion concentration in an electrolyte.

In one example, the function 220 includes Equation 1.

$$\frac{\partial(\varepsilon_e \bar{c}_e)}{\partial t} = \nabla \cdot (D_{e,\textit{eff}} \nabla \bar{c}_e) + a_s(1 - t_+^0)\bar{j} \qquad \text{[Equation 1]}$$

In Equation 1, $\bar{c}_e$, $\varepsilon_e$, and $D_{e,\textit{eff}}$ denote a Li ion concentration in an electrolyte, a volume fraction, and an effective diffusion coefficient, respectively. In addition, in Equation 1, $a_s$ denotes an effective surface area of an electrode active material, $t_+^0$ denotes an ion transference number, and $\bar{j}$ denotes information on a current density distribution in an electrode.

The function 230 may include a function used to calculate an ion concentration in a solid-phase of an electrode. The ion concentration in a solid-phase of an electrode may be a concentration of metal ions associated with a positive electrode active material of the battery. The ion concentration in a solid-phase of an electrode is, for example, a Li ion concentration in a positive electrode and a Li ion concentration in a negative electrode.

In one example, the function 230 includes Equation 2.

$$\frac{\partial c_s}{\partial t} = \frac{1}{r^2}\frac{\partial}{\partial r}\left(D_s r^2 \frac{\partial c_s}{\partial r}\right) \quad \text{[Equation 2]}$$

In Equation 2, $c_s$, r, and $D_s$ denote a Li ion concentration in a solid-phase of an electrode, a radius of an active material, and an ionic diffusion coefficient, respectively.

The function 240 may include at least one function used to determine estimated information about the battery. In one example, the function 240 includes at least one function to estimate an internal temperature, a voltage, and/or an SoC of the battery based on the internal information determined by the training model 210. For example, the function 240 includes at least one function to estimate the voltage of the battery based on the solid-phase electrode potential information. Additionally or alternatively, the function 240 includes at least one function to estimate the internal temperature of the battery based on, for example, the potential information of the battery and an ion concentration distribution. The ion concentration distribution refers to a Li ion concentration distribution in a solid-phase of an electrode and/or a Li ion concentration distribution in an electrolyte. Additionally or alternatively, the function 240 includes at least one function to estimate the SoC of the battery based on the ion concentration in a solid-phase of an electrode.

A calculation time of the main function of the electrochemical function may dominate 90% of a total calculation time of the electrochemical model. In one example, the battery model 200 is a model obtained by replacing the main function of the electrochemical model with the training model 210. Thus, the battery model 200 may reduce a calculation time while retaining the internal information of the battery.

Figure 3:
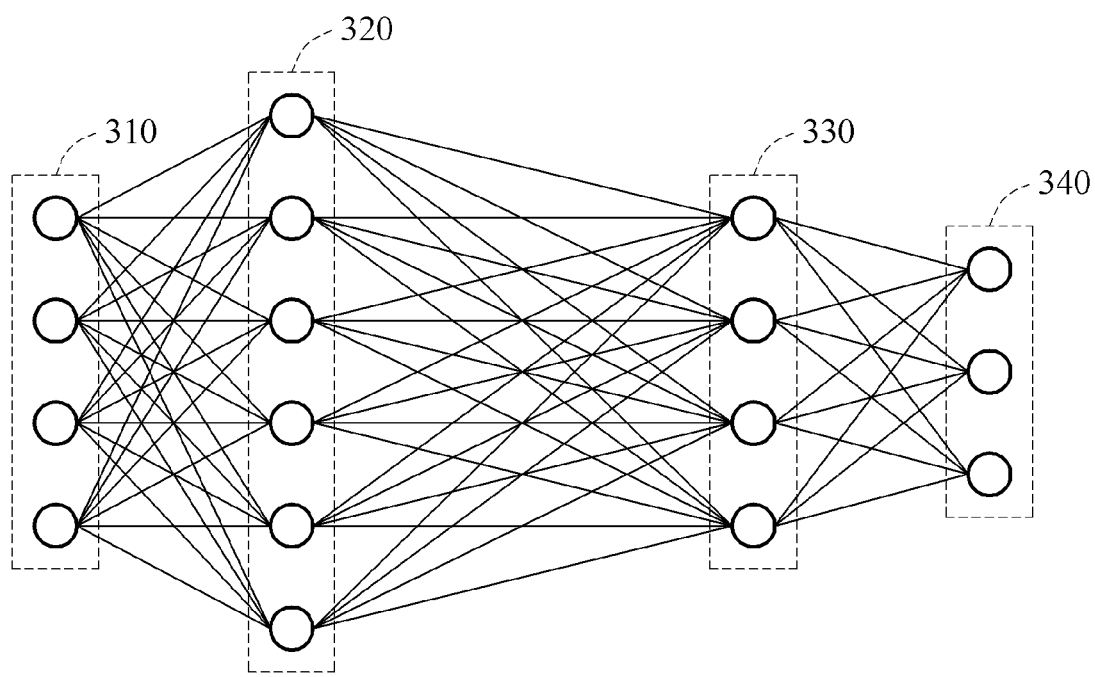
FIG. 3 is a diagram illustrating an example of a training model included in a battery model.

FIG. 3 is a diagram illustrating an example of a training model included in a battery model.

Referring to FIG. 3, a training model 300 is a neural network-based model including a plurality of layers 310 through 340. Each of the layers 310 through 340 includes a plurality of artificial neurons.

To the training model 300, a connection weight optimized through a training process may be applied. For example, each artificial neuron of the layers 310 through 340 is connected to a neighboring artificial neuron via a path designated with a connection weight.

An input layer 310 may receive, as an input, physical quantity information, for example, current information, from a current period, $period_t$. In addition, the input layer 310 may receive, as an input, a Li ion concentration in an electrolyte calculated in a previous period, $period_{t-1}$, electronic potential information determined in the previous period $period_{t-1}$, and ionic potential information determined in the previous period $period_{t-1}$.

The training model 300 may be a model generated to embody at least one main function among a plurality of functions of an electrochemical model to calculate electronic potential information, electrolyte potential information, and/or information on a current density distribution in an electrode of the battery. Based on an example, the training model 300 is a model generated to embody a matrix calculation generated during calculation of the main function of the electrochemical model. Thus, the training model 300 may determine electronic potential information and ionic potential information of the battery.

The battery model may determine internal information about the battery through the training model 300 without performing the calculation by the main function and the matrix calculation, and thus may perform calculations more rapidly than the electrochemical model.

Figure 4:
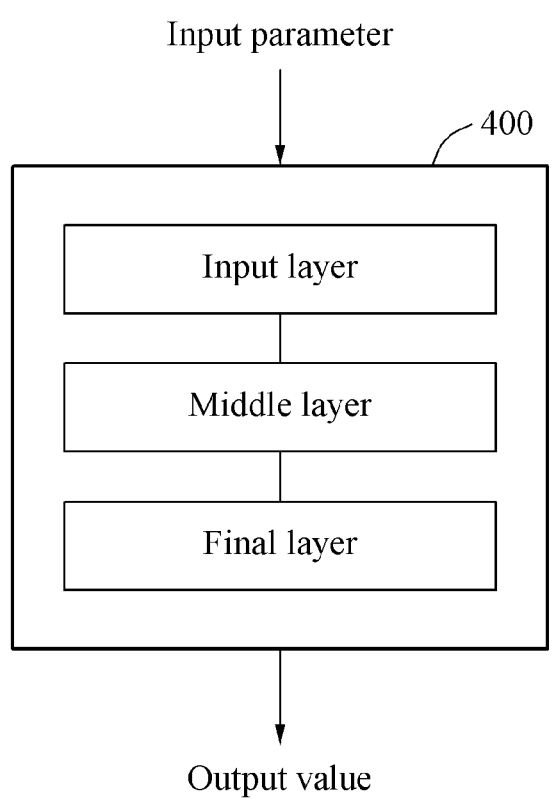
FIG. 4 is a diagram illustrating an example of a training method.

FIG. 4 is a diagram illustrating an example of a training method.

The training method may be performed by a training apparatus. The training apparatus may train a neural network of a training model described above. Hereinafter, the training of the neural network will be described in detail.

Referring to FIG. 4, an input parameter is applied to a neural network 400.

The input parameter may include at least one of potential information of an internal substance of a reference battery from a first period, information on an ion concentration in an electrolyte of the reference battery, for example, a Li ion concentration in an electrolyte, from the first period, information on an ion concentration in a solid-phase of electrode of the reference battery, for example, a Li ion concentration in a solid-phase of electrode, from the first period, internal temperature information of the reference battery from the first period, OCV information of the reference battery from the first period, and input current information of the reference battery from a second period. The input current information of the reference battery includes a result of sensing a current of the reference battery in the second period by a current sensor. The first period temporally precedes the second period. In a case of the second period being indicated as a $period_n$, the first period is indicated as a $period_{n-1}$. In one example, the input parameter to be applied to an input layer is one of a solid-phase of an electrode potential information (from the $period_{n-1}$), electrolyte potential information (from the $period_{n-1}$), information on a Li ion concentration in an electrolyte (from the $period_{n-1}$), information on a Li ion concentration in a solid-phase of an electrode (from the $period_{n-1}$), internal temperature information (from the $period_{n-1}$), and input current information (from the $period_n$), or a combination thereof.

The training apparatus may use a supervised learning method. In such a case, the training apparatus knows, in advance, an output parameter corresponding to the input parameter. The output parameter may include at least one of potential information of the internal substance of the reference battery from the second period, information on a current density distribution in an electrode of the reference battery from the second period, overpotential information of the reference battery from the second period. In one example, the output parameter includes one of electrolyte potential information (from the $period_n$), solid-phase electrode potential information (from the $period_n$), information on a current density distribution in an electrode (from the $period_n$), and overpotential information (from the $period_n$), or a combination thereof.

The neural network 400 may output an output value in response to the input parameter.

The training apparatus may calculate a loss based on a difference between the output parameter and the output value. The training apparatus may propagate the calculated loss backwards to the neural network 400 to determine a connection weight of each of the neurons included in the neural network 400.

The training apparatus may apply the connection weight to the neural network 400. The training apparatus may apply a subsequent input parameter to the neural network 400 to which the connection weight is applied. The training apparatus may output a new output value, and calculate a loss by comparing an output parameter corresponding to the input parameter and the new output value. The training apparatus may propagate the calculated loss backwards to the neural network 400 to adjust the connection weight of each neuron.

The training apparatus may optimize the connection weight of each neuron by repetitively performing a process of inputting an input parameter, calculating a loss, and performing backpropagation.

The optimized connection weight may be applied to the training model described above.

Figure 5:
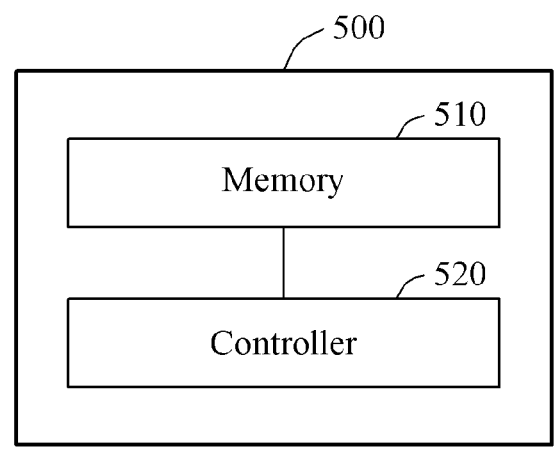
FIG. 5 is a diagram illustrating an example of an apparatus for estimating a state of a battery.

FIG. 5 is a diagram illustrating an example of a battery state estimating apparatus.

Referring to FIG. 5, a battery state estimating apparatus 500 includes a memory 510 and a controller 520.

The memory 510 may store a battery model. In addition, the memory 510 may store at least one instruction associated with an operation of the controller 520.

The controller 520 may receive physical quantity information about a sensed physical quantity of a battery.

The controller 520 may input the received physical quantity information to the battery model.

The controller 520 may obtain estimated information about the battery from the battery model. The descriptions provided with reference to FIGS. 1 through 4 are applicable to the example illustrated in FIG. 5, and thus a more detailed and repeated description is omitted here for brevity.

Figure 6:
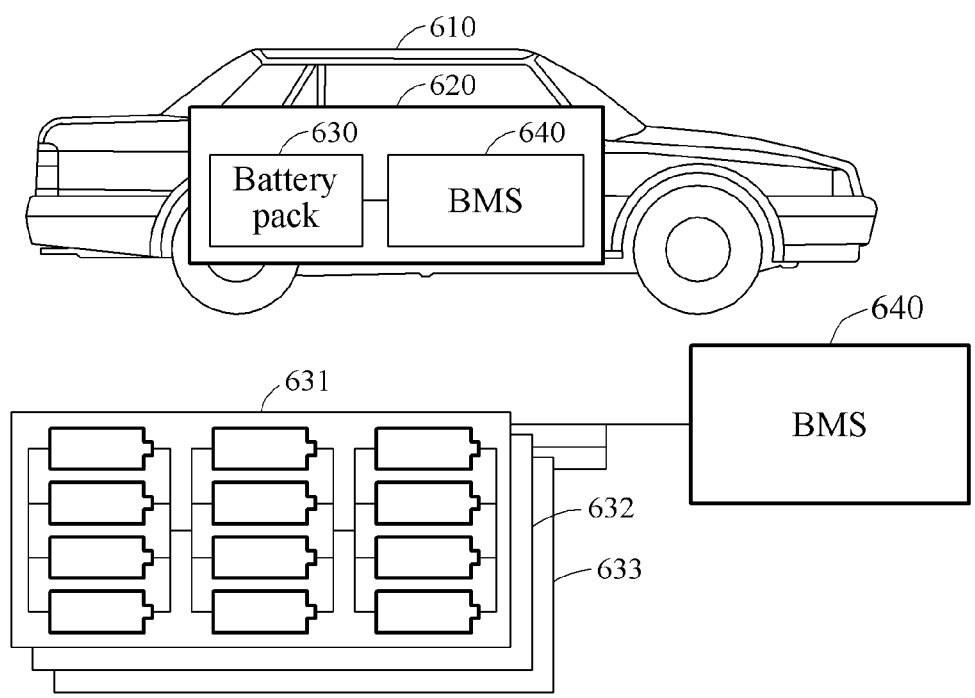
FIG. 6 is a diagram illustrating an example of a vehicle using a battery model.

FIG. 6 is a diagram illustrating an example of a vehicle.

FIG. 6 illustrates a vehicle 610. The vehicle 610 uses a battery pack 630 as a power source. The vehicle 610 is, for example, an electric vehicle and a hybrid vehicle. However, the vehicle 610 is not limited to the examples described in the foregoing.

Referring to FIG. 6, the vehicle 610 includes a battery system 620. The battery system 620 includes the battery pack 630 and a battery management system (BMS) 640. In the example of FIG. 6, the BMS 640 is illustrated as being located outside the battery pack 630. However, based on an example, the BMS 640 is located inside the battery pack 630.

The battery pack 630 includes a plurality of battery modules 631, 632, and 633. Each of the battery modules 631, 632, and 633 includes at least one battery cell.

The BMS 640 stores a battery model described above.

In addition, the BMS 640 performs a battery state estimating method described above.

The descriptions provided with reference to FIGS. 1 through 5 are applicable to the example illustrated in FIG. 6, and thus a more detailed and repeated description is omitted here for brevity.

Figure 7:
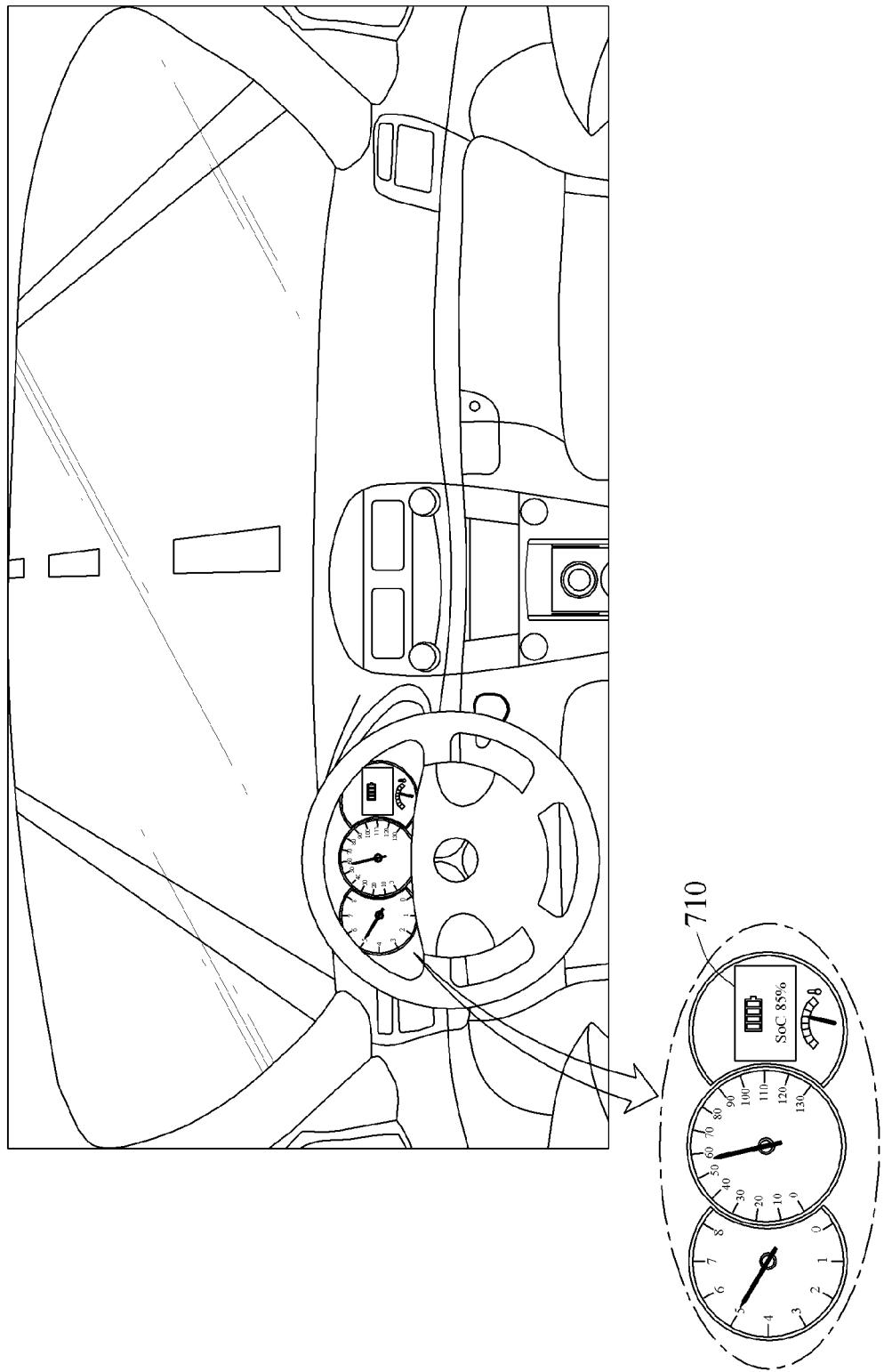
FIG. 7 is a diagram illustrating an example of providing state information to a user.

FIG. 7 is a diagram illustrating an example of provision of state information.

Referring to FIG. 7, state information 710 of a battery pack, for example, an SoC of the battery pack, is displayed on a display of a dashboard of a vehicle. A BMS of the vehicle may determine the state information 710 of the battery pack using a battery model. The BMS may transmit the state information 710 to a vehicle controller, for example, a vehicle control (VCU), and the vehicle controller displays the state information 710 on the display.

The apparatuses, units, modules, devices, and other components illustrated in FIGS. 2, 4, 5, and 6 that perform the operations described herein with respect to FIG. 1 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 1. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processor-implemented battery method to estimate a state of a battery, the method comprising:
receiving physical quantity information about a sensed physical quantity of a battery in a current period;
determining internal battery information comprising potential information of an internal material of the battery based on the physical quantity information by using a battery model;
calculating ion concentration in the battery based on the internal battery information by using the battery model; and
determining state information of the battery based on the ion concentration by using the battery model,
wherein the battery model is a model obtained by replacing a first function of an electrochemical model with a neural network model, and
wherein the neural network model is configured to generate the internal battery information in the current period using current information in the current period, an ion concentration in an electrolyte calculated in a previous period, electronic potential information determined in the previous period, and ionic potential information determined in the previous period.

2. The method of claim 1, wherein the potential information of the internal material comprises solid-phase electrode potential information and electrolyte potential information.

3. The method of claim 1, wherein
the sensed physical quantity comprises any one or any combination of any two or more of a sensed current, a sensed voltage, and a sensed temperature, and
the state information comprises any one or any combination of any two or more of an internal temperature, an estimated voltage, and a state of charge (SoC) of the battery.

4. The method of claim 1, wherein the internal battery information further comprises either one or both of a current density distribution of an electrode of the battery and overpotential information related to the electrode of the battery.

5. The method of claim 1, wherein
the neural network model is trained based on an output value in response to an input parameter of a reference battery and on an output parameter of the reference battery,
the input parameter comprises any one or any combination of any two or more of potential information about an internal substance of the reference battery from a first period, information about an ion concentration in an electrolyte of the reference battery from the first period, information about an ion concentration in a solid-phase of an electrode of the reference battery from the first period, internal temperature information about the reference battery from the first period, open-circuit voltage (OCV) information about the reference battery from the first period, and input current information about the reference battery from a second period, and
the output parameter comprises any one or any combination of any two or more of potential information of the internal material of the reference battery from the second period, information on a current density distribution in the electrode of the reference battery from the second period, and overpotential information of the reference battery from the second period.

6. The method of claim 5, wherein the reference battery is the battery.

7. A non-transitory computer-readable storage medium storing instructions that, when executed by a processor, cause the processor to perform the method of claim 1.

8. The method of claim 1, wherein the physical quantity information comprises any one or any combination of any two or more of current, voltage, and temperature.

9. An apparatus for estimating a state of a battery, the apparatus comprising:
a memory configured to store a battery model; and
a controller configured to receive physical quantity information about a sensed physical quantity of a battery in a current period, determine internal battery information comprising potential information of an internal material of the battery based on the physical quantity information by using the battery model, calculate ion concentration in the battery based on the internal battery information by using the battery model, and determine state information of the battery based on the ion concentration by using the battery model,
wherein the battery model is a model obtained by replacing a first function of an electrochemical model with a neural network model, and
wherein the neural network model is configured to generate the internal battery information in the current period using current information in the current period, an ion concentration in an electrolyte calculated in a previous period, electronic potential information determined in the previous period, and ionic potential information determined in the previous period.

10. The apparatus of claim 9, wherein the potential information of the internal material comprises solid-phase electrode potential information of the battery and electrolyte potential information of the battery.

11. The apparatus of claim 9, wherein
the sensed physical quantity comprises any one or any combination of any two or more of a sensed current, a sensed voltage, and a sensed temperature, and
the state information comprises any one or any combination of any two or more of an internal temperature, an estimated voltage, and a state of charge (SoC) of the battery.

12. The apparatus of claim 9, wherein the internal battery information further comprises either one or both of a current density distribution of an electrode of the battery and overpotential information related to the electrode of the battery.

13. The apparatus of claim 9, wherein
the neural network model is trained based on an output value in response to an input parameter of a reference battery and on an output parameter of the reference battery,
the input parameter comprises any one or any combination of any two or more of potential information about an internal substance of the reference battery from a first period, information about an ion concentration in an electrolyte of the reference battery from the first period, information about an ion concentration in a solid-phase of an electrode of the reference battery from the first period, internal temperature information about the reference battery from the first period, open-circuit voltage (OCV) information about the reference battery from the first period, and input current information about the reference battery from a second period, and
the output parameter comprises any one or any combination of any two or more of potential information of the internal material of the reference battery from the second period, information on a current density distribution in the electrode of the reference battery from the second period, and overpotential information of the reference battery from the second period.

14. The apparatus of claim 13, wherein the reference battery is the battery.

* * * * *